United States Patent [19]
Shaw

[11] Patent Number: 5,173,845
[45] Date of Patent: Dec. 22, 1992

[54] HIGH DENSITY FRONTPLANE INTERCONNECTION SYSTEM

[75] Inventor: Richard N. Shaw, Sterling, Va.

[73] Assignee: Star Technologies, Inc., Sterling, Va.

[21] Appl. No.: 456,426

[22] Filed: Dec. 26, 1989

[51] Int. Cl.⁵ .............................................. H05K 7/14
[52] U.S. Cl. ................................... 361/415; 361/399; 361/413
[58] Field of Search ............... 361/391, 399, 412, 413, 361/415; 211/41; 360/99.02, 99.06; 439/50, 51, 61

[56] References Cited

U.S. PATENT DOCUMENTS

| | | |
|---|---|---|
| 3,675,083 | 7/1972 | White . |
| 3,992,654 | 11/1976 | Springer et al. . |
| 4,002,381 | 1/1977 | Wagner et al. ................. 361/415 X |
| 4,134,631 | 1/1979 | Conrad et al. . |
| 4,151,580 | 4/1979 | Struger et al. . |
| 4,250,536 | 2/1981 | Barringer et al. . |
| 4,470,100 | 9/1984 | Rebaudo et al. . |
| 4,573,753 | 3/1986 | Vogl . |
| 4,602,829 | 7/1986 | De Andrea .................... 361/415 X |
| 4,893,405 | 1/1990 | Pennington .................... 361/413 X |

Primary Examiner—Leo P. Picard
Assistant Examiner—D. Sparks
Attorney, Agent, or Firm—Dickstein, Shapiro & Morin

[57] ABSTRACT

A novel frontplane structure for use with a plurality of parallelly mounted printed circuit boards having respective sets of a plurality of electrical connectors mounted to the front edge of the printed circuit boards is disclosed in which a multi-layer printed circuit board is mounted to a sheet metal sub-chassis that includes integral injector/ejector devices which, by means of a cam action, produce a reduction in the mechanical effort required to mate the frontplane with each of the connectors contained on the plurality of printed circuit board assemblies installed into a card cage assembly or computer chassis to which the frontplane is to be connected is disclosed. A plurality of high density printed circuit connectors are mounted to the multi-layer printed circuit board for interconnecting with the sets of connectors mounted to the front edges of the printed circuit board assemblies.

11 Claims, 3 Drawing Sheets

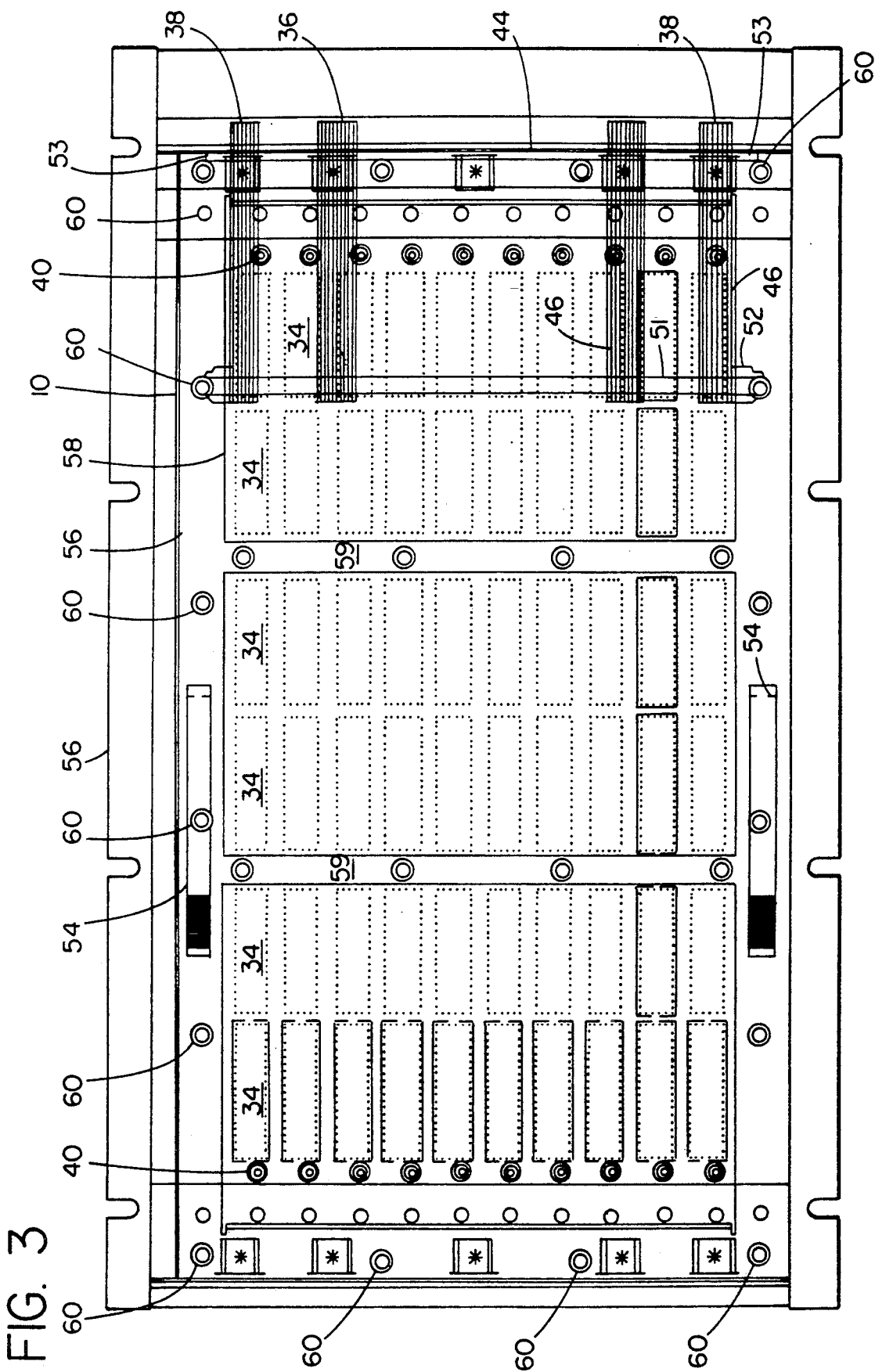

HIGH DENSITY FRONTPLANE INTERCONNECTION SYSTEM

BACKGROUND OF THE INVENTION

The present invention is directed generally to a computer or chassis box structure for holding a plurality of computer printed circuit board assemblies. More particularly, the present invention is directed to a computer chassis structure for holding a plurality of computer printed circuit board assemblies in which all of the connectors at one side of each of the printed circuit boards are engaged to their corresponding connectors upon the attachment of a frontplane structure.

As computers become more and more powerful and require more and more memory, and particularly in the case of computers which operate on a plurality of data in a parallel manner, it has increasingly become necessary to interconnect larger and larger circuit boards to each other. Due to the complexity of circuitry that can now be mounted on a large printed circuit board, there can be hundreds, if not thousands, of interconnections that must be made to each printed circuit board.

In the past, these interconnections have been accomplished by using either edge connectors at one edge of the printed circuit boards which plug into the appropriate connector mounted in a backplane, or by the use of multi-pin connectors mounted directly to the surface of the printed circuit board. Those multi-pin connectors plug into the corresponding multi-pin connectors mounted on the backplane. While in the past, such circuit board interconnections were sufficient, those interconnection systems no longer suffice in today's computing environment, particularly where a plurality of relatively large-sized printed circuit boards are being utilized.

In addition, in computer equipment in which the processing times are very fast, such as on the order of 40 megabits per second, there is a need to maintain as short an interconnecting path as possible between the components on each of the printed circuit boards that communicate with each other. For example, the electrical path from a component mounted on the half of the printed circuit board farthest away from the backplane connector must travel at least half the length of the printed circuit board before it even reaches a connector for that circuit board and can be transferred through the backplane to the appropriate circuit board which holds the component which is the destination of that signal.

Thus, the prior art devices have occasionally utilized connectors mounted to the opposite end of the printed circuit board not inserted into the backplane. They have utilized computer ribbon cables to connect between such connectors on adjoining or non-adjoining printed circuit boards. However, the use of such ribbon cables is disadvantageous because it increases the electrical path the signals flowing between these circuits must travel and it creates an additional step required during manufacture of the computer equipment to attach such ribbon cables. In addition, each of the ends of the ribbon cable must be carefully attached to the connectors in the circuit boards.

U.S. Pat. No. 4,470,100 to Rebaudo et al. illustrates a variation on the use of ribbon cables and connectors to interconnect boards. Rebaudo et al. disclose a welded card cage assembly for mounting a number of printed circuit boards in a mutually parallel configuration. Each card is constructed to include a first set of connectors mounted to one edge of the card. Two frame members are mounted to the other end of the card and a pair of connectors is mounted to the frame pieces. A ribbon connector cable connects the cable connectors to the printed circuit board. A backplane containing a plurality of connectors is then assembled to the welded card cage assembly. The connectors on the backplane are designed to connect to the connectors attached between the frame on each printed circuit board.

The apparatus disclosed by Rebaudo et al. creates several problems. Firstly, the use of ribbon cable increases the path to be travelled by signals between printed circuit boards. Secondly, using that device, it is difficult to align the pin connectors on the backplane with the pin connectors on a plurality of printed circuit boards such that no pins are bent during the insertion of the backplane connectors into the printed circuit board connectors. Thirdly, the effort required when more than just a few printed circuit boards are involved is quite high, making it even more difficult to accomplish the actual insertion of the connectors of the back portion into the connectors of the printed circuit board. In addition, Rebaudo, et al. presents the same difficulties described above in connection with pin alignment.

U.S. Pat. No. 4,151,580 to Struger et al. and U.S. Pat. No. 3,992,654 to Springer et al. both illustrate a rack for mounting a plurality of parallel circuit boards. The back edge of each circuit board is connected to a motherboard while an opposite edge includes terminal pads which align with a respective one of a plurality of individual movable sets of connectors in order to form an input/output connection plane. Those systems, however, do not provide a single frontplane system in which all of the connections are readily made in a single action upon attachment of the frontplane.

U.S. Pat. No. 4,134,631 to Conrad et al. discloses a modular plug board system which is utilized for testing certain circuit modifications with, for example, a central processing unit of a computer. The modular plug board system is used for interconnecting an array of parallel circuit cards in a card cage. The plug board is attached to a card cage and is connected directly to each of the plurality of circuit boards by a plurality of wires connected to a plurality of contacts which are used by the circuit modifying devices to make contact with certain components on the printed circuit boards. The Conrad et al. device is not designed for use in production computer equipment nor is it designed to provide interconnections between the circuit boards and components on the circuit boards. In addition, this approach is complex and costly to implement.

SUMMARY AND OBJECTS OF THE INVENTION

In view of the foregoing, it should be apparent that there still exists a need in the art for a method of and apparatus for interconnecting a second set of edge connectors of a plurality of printed circuit boards in such a manner that the connecting mechanism may be easily installed on the card cage or chassis to which the printed circuit boards are secured while at the same time ensuring that the plurality of pin connections to be made are made in an efficient and reliable manner. It is, therefore, a primary object of the invention to provide a method of and apparatus for interconnecting a plurality of printed circuit board connectors contained on a plurality of parallelly mounted printed circuit boards in an efficient manner while at the same time maintaining the integrity of each of the connections which is characterized by a reliable structure and which has particular application as a frontplane for a printed circuit board card cage or chassis.

More particularly, it is an object of this invention to provide a means for interconnecting an additional row of connectors located at the end of each of a plurality of parallelly mounted printed circuit boards opposite the backplane connectors in which the frontplane assembly readily mates with the additional connectors on the printed circuit board assemblies.

Still more particularly, it is an object of this invention to provide a frontplane assembly which is easily and readily installed to a plurality of parallelly mounted printed circuit board assemblies having connectors at the front end thereof in such a manner that the connections between the frontplane assembly and the connectors on the printed circuit boards are in proper alignment.

Another object of the present invention is to provide a reliable and relatively inexpensive frontplane assembly for use in interconnecting a plurality of parallelly mounted printed circuit board assemblies contained in a computer chassis.

A further object of the present invention is to provide a frontplane assembly for use with front connectors of a plurality of printed circuit board assemblies which are parallelly mounted in a card cage assembly in which the frontplane assembly consists of a multi-layer printed circuit board carrying a plurality of high density printed circuit connectors.

A still further object of the present invention is to provide a frontplane assembly for use with a plurality of printed circuit board assemblies mounted in a card cage assembly in which the printed circuit board assemblies have connectors at both the front and rear edges thereof and in which the frontplane assembly includes integral injector/ejector devices such that a mechanical advantage is achieved which allows the mating of the frontplane with many circuit board assemblies in a simultaneous manner.

Still more particularly, it is an object of this invention to provide a frontplane assembly which allows a significant increase in the number of interconnects between printed circuit board assemblies while also decreasing the length of circuit traces or conductors between adjacent printed circuit boards.

Briefly described, these and other objects of the invention are accomplished by the frontplane assembly of the instant invention which includes a multi-layer printed circuit board to which high density printed circuit connectors are mounted. The multi-layer printed circuit board is mounted to sheet metal subchassis that includes integral injector/ejector devices. These injector/ejector devices provide a cam action which produces a reduction in the mechanical effort required to mate the frontplane with each of the connectors contained on a plurality of printed circuit board assemblies installed into a card cage assembly to which the frontplane is to be connected. The frontplane accomplishes interconnection of the plurality of printed circuit board assemblies simultaneously and with a minimum of effort.

The frontplane of the present invention allows a significant increase in interconnects between the printed circuit board assemblies while at the same time decreasing the length of conductors and thus the length of the path travelled by signals between adjacent circuit boards. An approximately 90% decrease in distance travelled is achieved in instances where a connection between adjacent printed circuit boards is required at the end of the boards opposite the backplane to which the printed circuit board assemblies are mounted. Since the signals travel a shorter distance, the electrical performance of the computer equipment to which the frontplane of the present invention is assembled is greatly improved.

With these and other objects, advantages and features of the invention that may become hereinafter apparent, the nature of the invention may be more clearly understood by reference to the following detailed description of the invention, the appended claims and to the several drawings attached herein.

BRIEF DESCRIPTION OF THE DRAWING

FIG. 3 is a drawing showing the rear view of the frontplane assembly of the present invention;

DETAILED DESCRIPTION OF THE PREFERRED EMBODIMENT

Figure 1:
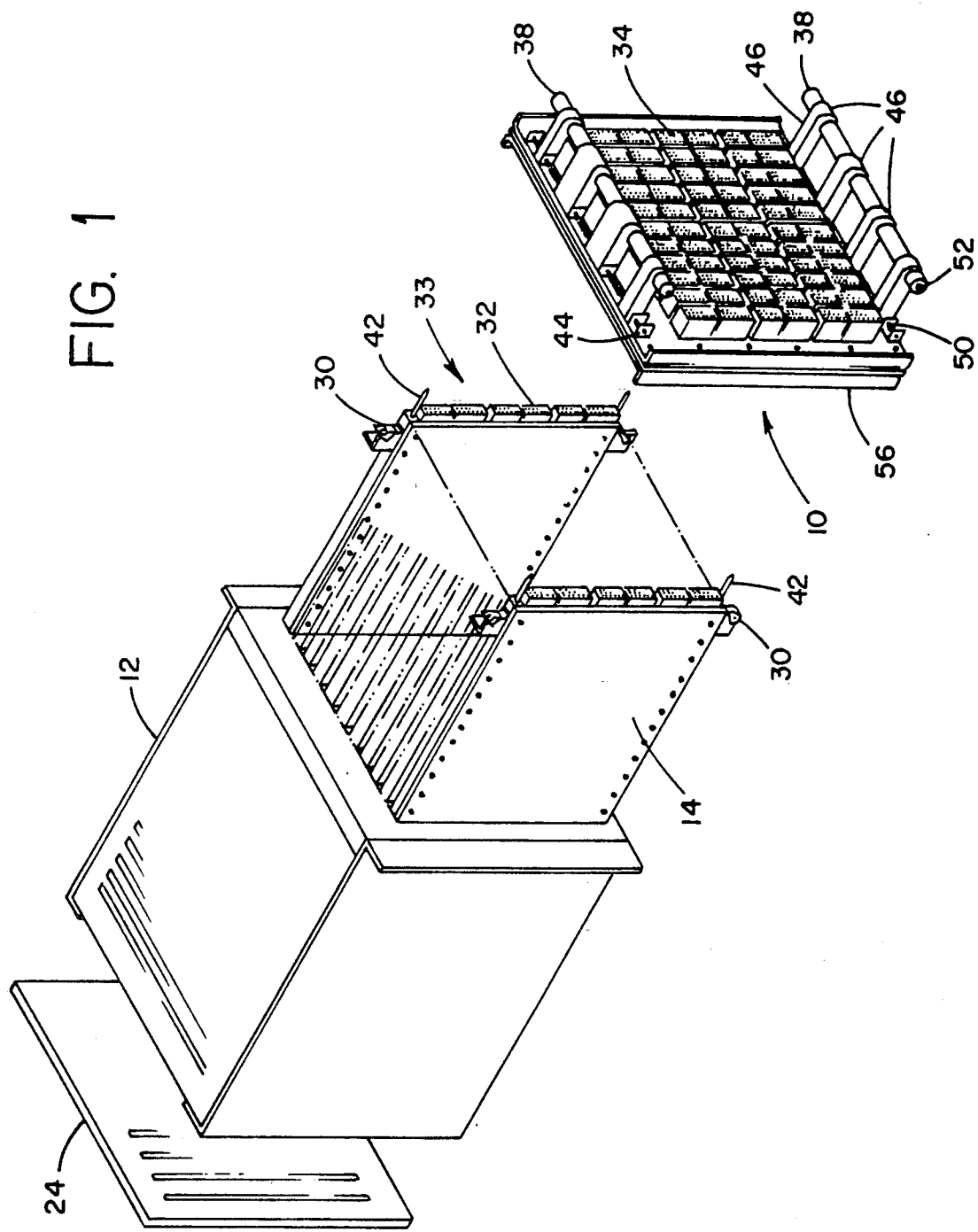
FIG. 1 is a perspective drawing showing the frontplane structure of the present invention and a computer chassis with which it may be utilized.

Referring now in detail to the drawings wherein like parts are designated by like reference numerals throughout, there is illustrated in FIG. 1 the frontplane 10 of the present invention shown in combination with a chassis 12 which is designed to hold a plurality of circuit board assemblies 14. Each of the circuit board assemblies utilizes a plurality of connectors 23, 27 and 29 at their rear edges (see FIG. 2) which engage in receiving connectors 22, 26 and 28 secured to the backplane 26 which forms the rear of the chassis 12. Each of the printed circuit board assemblies 14 includes a plurality of multi-pin connectors 32 attached to the front edges of each of the circuit boards. The corresponding connectors 34 carried on the frontplane connect with the circuit board assembly connectors 32, when the frontplane is attached to the computer chassis 12.

Figure 2:
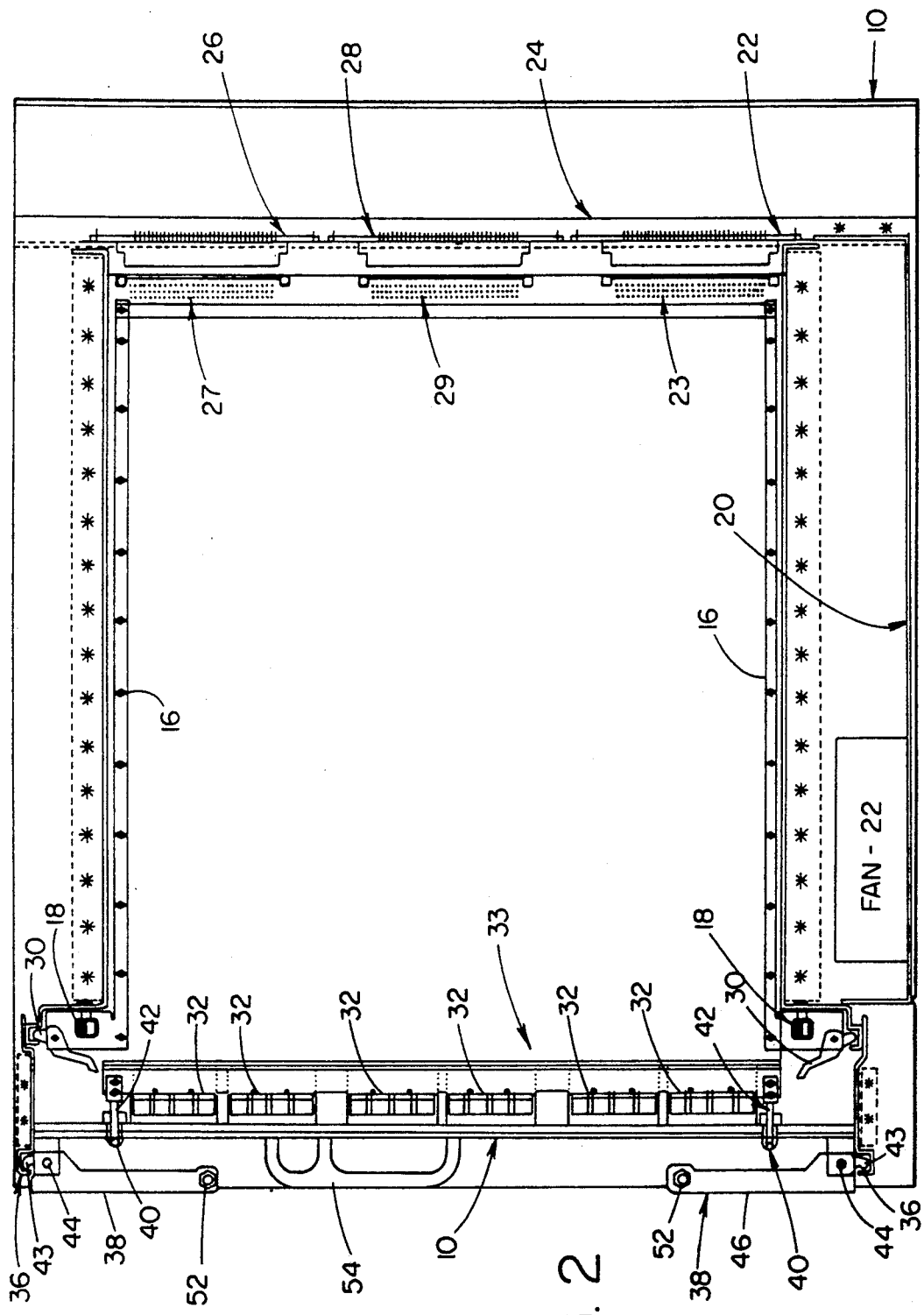
FIG. 2 is a drawing showing the side view of a card cage or computer chassis to which the frontplane assembly of the present invention is attached.

As shown in FIG. 2, the plurality of circuit board assemblies 14 are secured by elongated frame pieces 16 and a plurality of captive screws 18, to the chassis 12 in a known manner. Attached to the bottom portion of the chassis, which may form a cube or other rectangular solid shape, may be a fan tray assembly 20 which includes one or more fans 22 for providing cooling air for the plurality of circuit boards 14 secured in the chassis 12. The width of the chassis will vary depending upon the number of slots which are provided for securing the plurality of circuit boards 14. Typically, the frontplane assembly 10 of the present invention would be utilized with a chassis 12 which is designed to hold at least 10 printed circuit board assemblies 14.

Attached to the back portion of the chassis 12 and extending perpendicularly from the fan tray assembly 20 is a backplane 24 which may include a plurality of backplane connectors 22, 26 and 28 mounted in a known manner. When the computer chassis 12 together with the plurality of circuit board assemblies 14 and other components mounted to that computer chassis 12, form part of, for example, a computer assembly, the cables (not shown) from that computer assembly may be connected to the three connectors 26, 28 and 22. As will be obvious to those of ordinary skill in the art, any combination of the three connectors 22, 26 and 28, including the use of only a single connector 22, may be utilized. As will also be obvious, the number and type of connectors 22, 26 and 28 is dependent upon the use of the corresponding male or female connectors 27, 29 and 23 contained on each of the plurality of circuit board assemblies 14. Alternatively, the connectors 27, 29 and 23 can be implemented as edge card connectors.

Each circuit board requires its own set of connectors which are attached to the backplane 24 in such a manner that when each circuit board assembly 14 is assembled into the computer chassis 12, the connectors on that circuit board assembly are connected to the respective connectors 22, 26 and 28 for each circuit board assembly 14. The connectors 22, 23, 26, 27, 28 and 29 may be DIN 41612 connectors, available from various manufacturers.

Alternatively, each of the circuit board assemblies 14 may be constructed such that the connectors 22, 26 and 28 are mounted directly to that circuit board and thus the need for a backplane 24 containing the connectors 22, 26 and 28 may be eliminated.

The connectors 22, 26 and 28 may also be, for example, a part of a VME backplane connector, as necessary depending upon the function of the circuit board assemblies 14 and the computer system, or other device, to which the circuit board assemblies 14 are to be connected. Other types of connector systems may also be utilized.

Once the circuit board assemblies 14 are connected to the backplane 24 of the chassis 12 and secured by means of the injector/ejector lever 30 and captive screws 18 to the chassis 12, the frontplane assembly 10 may be secured to the computer chassis 12 while at the same time be connected to a plurality of connectors 32 which are attached to the front of each of the circuit board assemblies 14. It is necessary to utilize both front and back sets of connectors with circuit board assemblies such as those shown as element 14 in FIGS. 1 and 2 in instances where there is either more circuitry contained on the circuit board assembly than can be connected to a set of connectors at one end of the circuit board assembly. Also, where large printed circuit board assemblies are utilized and the times for signals to traverse lead lines are critical, such as, for example, during array processing, parallel computing or other supercomputing applications, it is desirable to route the leads from the circuitry contained on the front half of a circuit board to connectors at the front end of the circuit board. At the same time, the leads from circuitry contained on the rear half of the circuit board are routed to connectors attached to the rear of the circuit board.

Under such circumstances, where a plurality of front connectors 32 are utilized for each circuit board and, where a plurality of circuit boards are contained within the computer chassis 12, the effort required to attach a frontplane which includes a plurality of connectors 34 becomes very high. In addition, the possibility of an occurrence of a misalignment of connector pins also becomes very high. The present invention is designed to address such problems and to allow the simultaneous connection of, for example, at least 4,000 pin connections, to occur at the same time that the frontplane assembly 10 is attached to the computer chassis 12.

As shown in the figures, the frontplane assembly 10 may be provided with a plurality of six row connector assemblies 35, one for each respective circuit board assembly. FIG. 2 shows a single six row connector assembly showing each of the connectors 34 while FIG. 1 shows a plurality of such connector assemblies 35. Such connectors may typically be 80 pin connectors utilized in a well known manner in the computer art. Each printed circuit board assembly 14 is provided with a row 33 of corresponding connectors 32 for connection to the connector assemblies 35 contained on the frontplane assembly 10. Thus, each circuit board assembly may be provided with, for example, 480 pin connections at the frontplane 10. The frontplane assembly 10 includes a multilayer printed circuit board 58 to which the connector assemblies 35 are mounted. Alternatively, the printed circuit board 58 may be a multi-wire board or a wire wrapped circuit board.

The frontplane assembly 10 of the present invention includes a plurality of stacked ejectors 38 which are pivotally connected to the frontplane assembly by means of a rod 44 bolted to the outer stiffening frame 56 of the frontplane assembly 10. Each of the stacked ejectors 38 includes a cam member 43 which is of a modified hook shape and is designed to engage the stacked ejector in a frontplane ejector channel 36 which forms part of the computer chassis 12 in a known manner.

A plurality of guide pins 42 are mounted to the front of each of the circuit board assemblies 14 in a known manner and are received by a like plurality of guide pin receptors 40 which are mounted to the rear of the frontplane assembly 10 at both ends of each row of connectors 35. When the stacked ejectors 38, by pivoting about the pivot rod 44, pull the frontplane assembly towards the printed circuit assemblies 14, those guide pins 42 and guide pin receptors 40 serve to align the plurality of frontplane connectors 34 with their counterparts 32 attached to the front edges of the printed circuit assemblies 14.

Each of the ejector handles 38 is constructed from four upright portions 46, each of which pivots about a respective pivot element 50. Each of the four upright portions 46 of the stacked ejectors 38 are connected by means of a rod 51 or other suitable connector, which is secured between the upright portions 46 of the stacked ejectors 38 by means of suitable connectors, such as nuts 52. The pivot rod 44 is secured to the pivot elements 50 by means of appropriate fasteners 53.

FIG. 3 shows a rear view of the frontplane assembly 10. As shown in that figure, the frame 56 of the frontplane assembly 10 has attached thereto a circuit board assembly 58 which is suitably mounted to all four sides of the frontplane assembly 10 by means of a plurality of appropriate fasteners 60. The circuit board assembly 58 carries the plurality of connectors 34 which mate with the front edge connectors 32 mounted on each of the printed circuit board assemblies 14.

The stiffening frame assembly 56 of the frontplane assembly 10 includes two stiffening elements 59. The function of those stiffening elements 59 is to provide enough rigidity to the frontplane assembly 10 itself such that the entire frontplane assembly 10 can be mounted to the computer chassis assembly at the same time each of the pins of each of the plurality of connectors 34 is engaged in each of the receiving elements in each of the receiving connectors 32.

The frontplane assembly 10 may be constructed from two single pieces of sheet metal 57 and 59 each of an appropriate thickness which sandwich the circuit board assembly 58 between them. Each of the elements 57 and 59 have suitable openings punched therein for mounting of the connectors 34. The stiffening elements 59 may preferably be reinforcing elements fastened to the outside frame sections of the inner sheet metal piece 59 of the frontplane assembly 10, between the banks of connectors. Stiffening elements 57 and 59 prevent any damage caused by deflection during mating and unmating of the frontplane assembly 10.

Alternatively, the reinforcing elements 59 may be provided by any known structural elements which provide the requisite cross-stiffening force for the frontplane assembly 10. Two handles 54 are also provided for ease in removing the frontplane assembly 10 from the computer chassis 12 after the stacked ejectors 38 have been rotated out of their locked positions such that the locking elements 43 are no longer engaged in the ejector channels 36.

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. A frontplane structure for use with at least one printed circuit board assembly mounted in a cabinet, said cabinet including a backplane structure carrying at least one first electrical connector having a plurality of contacts, said at least one printed circuit board assembly including at least one second electrical connector having a like plurality of contacts at a first end thereof for connection to said electrical connector carried by said backplane, and said printed circuit board assembly further including at least one third electrical connector having a plurality of contacts mounted at a second and opposite end from said first end, said frontplane structure comprising:
    a frame;
    a circuit board assembly carrying at least one electrical connector having a plurality of contacts mounted to said frame; and
    at least two combination ejector and insertion elements connected to said frame and constructed to apply sufficient force to said frame such that the said at least one electrical connector carried by said circuit board assembly is adapted to be mounted to and ejected from at least one third electrical connector mounted at a second end of at least one printed circuit board assembly.

2. The frontplane structure of claim 1, wherein said frame includes at least one stiffening element for providing increased rigidity to said circuit board assembly.

3. The frontplane structure of claim 1, wherein said cabinet further includes locking channel elements and said ejector elements include cam portions for attachment to said locking channel elements in order to assist in engagement of said at least one electrical connector carried by said circuit board assembly with at least one third electrical connector mounted at a second end of a printed circuit board assembly.

4. The frontplane structure of claim 1, wherein said ejector elements are pivotally mounted to said frame.

5. The frontplane structure of claim 1, wherein said frame comprises two rectangularly shaped elements between which said circuit board assembly is mounted.

6. A cabinet structure containing a plurality of printed circuit board assemblies, each of said plurality of printed circuit board assemblies including at least one first multi-contact electrical connector mounted to an end thereof such that said electrical connectors make electrical contact with a like plurality of second multi-contact electrical connectors mounted to a backplane of said cabinet, each of said plurality of printed circuit board assemblies also including at least one third multi-contact electrical connector mounted to an opposite end thereof, said cabinet further comprising a frontplane structure, comprising:
    a frame;
    a circuit board assembly carrying at least one fourth multi-contact electrical connector for making electrical contact with said at least one third multi-contact electrical connector mounted to each of said plurality of printed circuit board assemblies contained in said cabinet structure; and
    combination insertion and ejection structure mounted to said frame for enabling proper engagement and disengagement of said at least one fourth multi-contact electrical connector carried by said circuit board assembly with said at least one third multi-contact electrical connector mounted to each of said plurality of printed circuit board assemblies.

7. The cabinet structure of claim 6, wherein said frame includes at least one stiffening element for providing increased rigidity to said circuit board assembly.

8. The cabinet structure of claim 6, wherein said cabinet further includes locking channel elements, and said insertion structure includes cam portions for attachment to said locking channel elements in order to assist in engagement of said at least one third multi-contact electrical connector carried by said circuit board assembly with said at least one second multi-contact electrical connector mounted to each of said plurality of printed circuit board assemblies.

9. The cabinet structure of claim 6, wherein said insertion structure includes handles which are pivotally attached to said frame.

10. The cabinet structure of claim 6, wherein said frame comprises two rectangularly shaped elements between which said circuit board assembly is mounted.

11. A frontplane structure for use with at least one printed circuit board assembly mounted in a cabinet, said cabinet including a backplane structure carrying at least one first electrical connector having a plurality of contacts, said at least one printed circuit board assembly including at least one second electrical connector having a like plurality of contacts at a first end thereof for connection to said electrical connector carried by said backplane, and said printed circuit board assembly further including at least one third electrical connector having a plurality of contacts mounted at a second and opposite end from said first end, said frontplane structure comprising:
    a frame;
    a circuit board assembly carried by said frame, said circuit board assembly carrying at least one electrical connector having a plurality of contacts mounted to said frame; and
    at least two combination ejector and insertion elements carried by said frame and constructed to apply sufficient force to said frame such that the said at least one electrical connector carried by said circuit board assembly adapted to be mounted to and ejected from said at least one third electrical connector mounted at a second end of at least one printed circuit board assembly as said frame is disconnected from and connected to a cabinet.

* * * * *